United States Patent
Kim

(10) Patent No.: US 9,502,480 B2
(45) Date of Patent: Nov. 22, 2016

(54) ORGANIC LIGHT-EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Jae Hoon Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/721,860

(22) Filed: May 26, 2015

(65) Prior Publication Data

US 2016/0247861 A1 Aug. 25, 2016

(30) Foreign Application Priority Data

Feb. 24, 2015 (KR) ........................ 10-2015-0025517

(51) Int. Cl.
| | | |
|---|---|---|
| H01L 51/52 | (2006.01) | |
| H01L 27/32 | (2006.01) | |
| H01L 51/50 | (2006.01) | |
| H01L 51/56 | (2006.01) | |

(52) U.S. Cl.
CPC ....... H01L 27/3246 (2013.01); H01L 51/5088 (2013.01); H01L 51/5096 (2013.01); H01L 51/56 (2013.01); *H01L 27/326* (2013.01); *H01L 51/5271* (2013.01); *H01L 2227/323* (2013.01)

(58) Field of Classification Search
CPC ............. H01L 27/3246; H01L 27/326; H01L 51/5271
USPC ............................................ 438/29; 257/40
See application file for complete search history.

(56) References Cited

U.S. PATENT DOCUMENTS

| | | | | |
|---|---|---|---|---|
| 7,956,351 B2* | 6/2011 | Choi | ................... | H01L 27/3246 257/40 |
| 8,686,629 B2* | 4/2014 | Oh | ...................... | H01L 27/3246 313/504 |
| 2002/0056842 A1* | 5/2002 | Yamazaki | ........... | H01L 27/3246 257/79 |
| 2005/0258745 A1* | 11/2005 | Tsujimura | ........... | H01L 27/3246 313/506 |
| 2010/0051912 A1* | 3/2010 | Gregory | .............. | H01L 27/3246 257/40 |
| 2013/0248867 A1* | 9/2013 | Kim | .................... | H01L 51/5253 257/59 |
| 2014/0131310 A1* | 5/2014 | Jiang | ................. | G02F 1/133516 216/24 |
| 2015/0090989 A1* | 4/2015 | Matsumoto | ............. | H01L 51/56 257/40 |
| 2015/0194629 A1* | 7/2015 | Liu | ........................ | H01L 51/56 257/40 |

FOREIGN PATENT DOCUMENTS

| | | | |
|---|---|---|---|
| CN | 104393192 A | * | 3/2015 |
| JP | 2007-227289 A | | 9/2007 |
| JP | 2011-009017 A | | 1/2011 |
| KR | 10-2006-0079982 A | | 7/2006 |
| KR | 10-2006-0133670 A | | 12/2006 |

* cited by examiner

*Primary Examiner* — George Fourson, III

(74) *Attorney, Agent, or Firm* — Lewis Roca Rothgerber Christie LLP

(57) ABSTRACT

An organic light-emitting diode (OLED) display device includes a substrate, a first electrode on the substrate, a pixel defining layer on the substrate and having an opening that partially exposes the first electrode, an organic layer on the first electrode, and a second electrode on the organic layer and the pixel defining layer, wherein the opening includes a lower region adjacent to the first electrode, an upper region adjacent to the second electrode, and a middle region between the lower region and the upper region, wherein the middle region has a width that is greater than a width of the lower region and is greater than a width of the upper region.

19 Claims, 11 Drawing Sheets

ORGANIC LIGHT-EMITTING DISPLAY DEVICE AND METHOD OF MANUFACTURING THE SAME

CROSS-REFERENCE TO RELATED APPLICATION

This application claims priority to and the benefit of Korean Patent Application No. 10-2015-0025517, filed on Feb. 24, 2015 in the Korean Intellectual Property Office, the disclosure of which is incorporated herein by reference in its entirety.

BACKGROUND OF THE INVENTION

1. Field

The present invention relates to an organic light-emitting diode (OLED) display device and a method of manufacturing the same.

2. Description of the Related Art

Organic light-emitting diode (OLED) display devices are drawing attention as next-generation display devices due to their wide viewing angle, high contrast, and fast response time. In an OLED display device, an organic light-emitting layer includes an emitting layer between an anode and a cathode. The emitting layer is made of an organic material. When positive and negative voltages are respectively applied to these electrodes (i.e., to the anode and to the cathode), holes move from the anode to the emitting layer via a hole-injection layer and a hole-transporting layer, and electrons move from the cathode to the emitting layer via an electron-injection layer and an electron-transporting layer. The electrons and the holes recombine in the emitting layer to generate excitons. As the excitons change from an excited state to a ground state, the emitting layer emits light. As a result, an image is displayed.

The OLED display device includes a pixel defining layer having an opening that exposes an upper surface of the anode, and the organic light-emitting layer is formed on the anode that is exposed through the opening of the pixel defining layer. The cathode is formed on the organic light-emitting layer and the pixel defining layer.

Some layers of the organic light-emitting layer may be formed by a solution process. The solution process includes preparing a solution composition by mixing an organic material for forming a desired layer with a solvent and ejecting the solution composition into the opening of the pixel defining layer. Here, the pixel defining layer is liquid-repellent, and the anode is lyophilic. Thus, a pinning point of the solution composition may be formed at a certain location in the pixel defining layer. If the pinning point is formed in an upper portion of the pixel defining layer, the hole-injection layer may directly contact the cathode. As such, because the hole-injection layer and the cathode are directly connected to each other without the emitting layer, a leakage current is generated between the hole-injection layer and the cathode.

SUMMARY

Aspects of the present invention provide an organic light-emitting diode (OLED) display device that can prevent or reduce generation of leakage current.

Aspects of the present invention also provide a method of manufacturing an OLED display device that can prevent or reduce generation of leakage current.

However, aspects of the present invention are not limited to those set forth herein. The above and other aspects of the present invention will become more apparent to one of ordinary skill in the art to which the present invention pertains by referencing the detailed description of the present invention provided below.

According to one or more embodiments of the invention, an organic light-emitting diode (OLED) display device includes a substrate, a first electrode on the substrate, a pixel defining layer on the substrate and having an opening that partially exposes the first electrode, an organic layer on the first electrode, and a second electrode on the organic layer and the pixel defining layer, wherein the opening includes a lower region adjacent to the first electrode, an upper region adjacent to the second electrode, and a middle region between the lower region and the upper region, wherein the middle region has a width that is greater than a width of the lower region and is greater than a width of the upper region.

The width of the opening is gradually reduced from the middle region toward the lower region and from the middle region toward the upper region.

The width of the opening is reduced at a gradually decreasing rate.

The width of the opening is reduced at a constant rate.

The pixel defining layer includes a lower surface that contacts the substrate and the first electrode, an upper surface that contacts the second electrode, and a side surface that connects respective sides of the upper surface and the lower surface, and the side surface includes a first side surface that slopes downward toward a central portion of the pixel defining layer and a second side surface that slopes upward toward the central portion of the pixel defining layer.

The OLED display device further includes a leakage current blocking layer that covers at least a portion of the first side surface.

The organic layer includes a hole-injection layer and an organic emitting layer on the hole-injection layer, wherein ends of the hole-injection layer are not connected to the second electrode.

According to another aspect of one or more embodiments of the present invention, an OLED display device including a substrate, a first electrode on the substrate, a pixel defining layer on the substrate and having an opening that partially exposes the first electrode, an organic layer on the first electrode, and a second electrode on the organic layer and the pixel defining layer, wherein the pixel defining layer includes a lower region adjacent to the first electrode, an upper region adjacent to the second electrode, and a middle region between the lower region and the upper region, and wherein a cross-sectional area of the upper region and a cross-sectional area of the lower region are each greater than a cross-sectional area of the middle region.

A cross-sectional area of the pixel defining layer is gradually reduced from the upper region toward the middle region and from the lower region toward the middle region.

The pixel defining layer includes a lower surface that contacts the first electrode, an upper surface that contacts the second electrode, and a side surface that connects respective sides of the lower surface and the upper surface, and wherein the side surface includes a first side surface that slopes downward toward a central portion of the pixel defining layer and a second side surface that slopes upward toward the central portion of the pixel defining layer.

The first side surface is an inclined surface having a first slope and the second side surface is an inclined surface having a second slope.

The first side surface is a curved surface that slopes downward toward the central portion of the pixel defining layer and the second side surface is a curved surface that slopes upward toward the central portion of the pixel defining layer.

The OLED display device further includes a leakage current blocking layer covering at least a portion of the first side surface.

The organic layer includes a hole-injection layer and an organic emitting layer located on the hole-injection layer, wherein ends of the hole-injection layer are not connected to the second electrode.

According to another aspect of one or more embodiments of the present invention, there is provided a method of manufacturing an OLED display device, the method including forming a first electrode on a substrate, coating a pixel defining layer composition on a first surface of the substrate, selectively curing the pixel defining layer composition by selectively irradiating light on the first surface of the substrate and selectively providing heat to a second surface of the substrate, forming a pixel defining layer having an opening that partially exposes the first electrode, the opening being formed by removing an uncured region of the pixel defining layer composition, forming an organic layer in the opening, and forming a second electrode on the organic layer and the pixel defining layer.

The pixel defining layer includes a lower surface that contacts the substrate and the first electrode, an upper surface that contacts the second electrode, and a side surface that connects respective sides of the upper surface and the lower surface, wherein the side surface includes a first side surface that slopes downward toward a central portion of the pixel defining layer and a second side surface that slopes upward toward the central portion of the pixel defining layer.

The selectively curing of the pixel defining layer composition includes irradiating light to a region of the first surface of the substrate using a mask, the mask including a light-transmitting portion and a light-blocking portion and the region of the first surface of the substrate corresponding to the light emitting portion, and providing heat to a region of the second surface of the substrate corresponding to the light-transmitting portion by placing a heating member on the region of the second surface of the substrate.

The pixel defining layer composition is gradually cured by the light from an upper portion toward a lower portion thereof and is gradually cured by the heat from the lower portion toward the upper portion thereof.

The organic layer is formed by a solution process.

The organic layer includes a hole-injection layer and an organic emitting layer located on the hole-injection layer, wherein ends of the hole-injection layer are not connected to the second electrode.

BRIEF DESCRIPTION OF THE DRAWINGS

The above and other aspects and features of the present invention will become more apparent by the description of example embodiments herein with reference to the attached drawings, in which.

DETAILED DESCRIPTION

Figure 1:
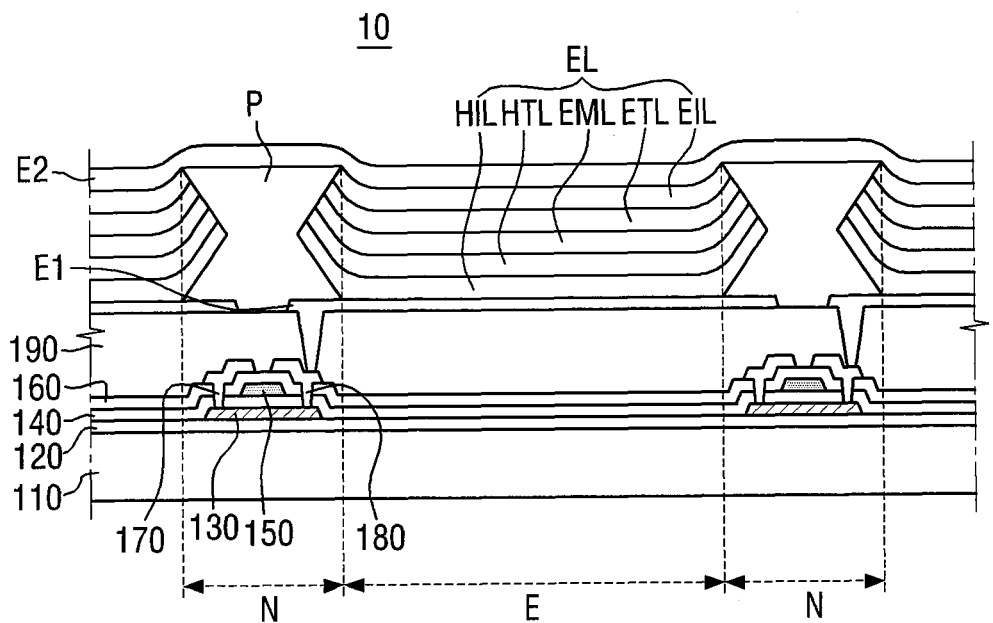
FIG. 1 is a cross-sectional view of an organic light-emitting diode (OLED) display device according to one or more embodiments of the present invention.

Various aspects and features of the present invention and methods for achieving the aspects and features will be apparent by referring to the embodiments described below with reference to the accompanying drawings. However, the present invention is not limited to the embodiments disclosed hereinafter, but can be implemented in diverse forms. The matters defined in the description, such as the detailed construction and elements, are specific details provided to assist those of ordinary skill in the art in a comprehensive understanding of the invention.

It will be understood that when an element or layer is referred to as being "on", "connected to" or "coupled to" another element or layer, it can be directly on, connected or coupled to the other element or layer or intervening elements or layers may be present. When an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Although the terms "first," "second," etc. are used to describe diverse constituent elements, such constituent elements are not limited by the terms. The terms are used only to distinguish a constituent element from other constituent elements. Accordingly, in the following description, a first constituent element may be termed a second constituent element without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as an "upper" element relative to a "lower" element or features would then be oriented as a "lower" element or feature. Thus, the exemplary term "upper" can encompass both an orientation of "upper" and "lower". The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the term "substantially," "about," and similar terms are used as terms of approximation and not as terms of degree, and are intended to account for the inherent variations in measured or calculated values that would be recognized by those of ordinary skill in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described below with reference to the accompanying drawings, in which example embodiments of the invention are shown.

FIG. 1 is a cross-sectional view of an organic light-emitting diode (OLED) display device (or organic light emitting display device) 10 according to one or more embodiments of the present invention.

The OLED display device 10 according to one or more embodiments of the present invention may include a plurality of pixels, and FIG. 1 is a cross-sectional view of one of the pixels. Referring to FIG. 1, the OLED display device 10 includes a substrate 110, a pixel defining layer P, and an organic layer EL. In addition, the OLED display device 10 may further include a buffer layer 120, a semiconductor pattern 130, a gate insulating layer 140, a gate electrode 150, an interlayer insulating film 160, a source electrode 170, a drain electrode 180, a planarization layer 190, a first electrode E1, and a second electrode E2.

The substrate 110 may be a transparent insulating substrate. The insulating substrate may be made of a material such as glass, quartz, polymer resin, etc. Examples of the polymer material include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT or TAC), cellulose acetate propionate (CAP), and various combinations thereof. In some embodiments, the insulating substrate may be a flexible substrate made of a flexible material such as PI.

The substrate 110 may include emission regions E and a non-emission region N. Each of the emission regions E may be a region where light is emitted out of the display device, and the non-emission region N may be a region where light is not emitted out of the display device. In addition, each of the emission regions E may correspond to a region in which the pixel defining layer P is not located, and the non-emission region N may correspond to a region including the pixel defining layer P (i.e., the pixel defining layer P may be located in the non-emission region N). As such, the emission regions E and the non-emission region N may be defined or determined by the pixel defining layer P. When viewed from above, the emission regions E may be arranged in a matrix, and the non-emission region N may surround the emission regions E.

The buffer layer 120 may be formed on the substrate 110. The buffer layer 120 may prevent the diffusion of metallic atoms, impurities, etc. from the substrate 110. In addition, if a surface of the substrate 110 is not even, the buffer layer 120 may improve the flatness of the surface of the substrate 110. The buffer layer 120 may be made of a silicon compound. For example, the buffer layer 120 may include silicon oxide, silicon nitride, silicon oxynitride, silicon oxycarbide, silicon carbonitride, etc. These materials may be used alone or in any suitable combination.

The semiconductor pattern 130 may be formed on the buffer layer 120. The semiconductor pattern 130 may include a source region, a drain region, and a channel region. In addition, the semiconductor pattern 130 may be made of amorphous silicon, polycrystalline silicon, or monocrystalline silicon. In one or more embodiments, the semiconductor pattern 130 may be made of an oxide semiconductor. The semiconductor pattern 130 may be formed by a photolithography method, but the present invention is not limited thereto.

The gate insulating layer 140 may be formed on the buffer layer 120 and may cover the semiconductor pattern 130. The gate insulating layer 140 may be made of silicon oxide, metal oxide, etc. Examples of the metal oxide that may be used for the gate insulating layer 140 include hafnium oxide (HfOx), aluminum oxide (AlOx), zirconium oxide (ZrOx), titanium oxide (TiOx), and tantalum oxide (TaOx). These materials may be used alone or in any suitable combination. The gate insulating layer 140 may be formed by a deposition method, but the present invention is not limited thereto.

The gate electrode 150 may be formed on the gate insulating layer 140. The gate electrode 150 may be formed on a portion of the gate insulating layer 140 that is located on the semiconductor pattern 130. The gate electrode 150 may include a metal, an alloy, a metal nitride, a conductive metal oxide, a transparent conductive material, etc. For example, the gate electrode 150 may include aluminum (Al), an aluminum-containing alloy, aluminum nitride (AlNx), silver (Ag), a silver-containing alloy, tungsten (W), tungsten nitride (WNx), copper (Cu), a copper-containing alloy, nickel (Ni), chrome (Cr), chrome nitride (CrOx), molybdenum (Mo), a molybdenum-containing alloy, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These materials may be used alone or in any suitable combination. The gate electrode 150 may be formed by a photolithography method, but the present invention is not limited thereto.

The interlayer insulating film 160 may be formed on the gate insulating layer 140 and may cover the gate electrode 150. The interlayer insulating film 160 may be made of a silicon compound. For example, the interlayer insulating film 160 may include silicon oxide, silicon nitride, silicon oxynitride, silicon carbonitride, silicon oxycarbide, etc.

These materials may be used alone or in any suitable combination. The interlayer insulating film 160 may insulate the gate electrode 150 from the source electrode 170 and the drain electrode 180. The interlayer insulating film 160 may be formed by a deposition method, but the present invention is not limited thereto.

The source electrode 170 and the drain electrode 180 may be formed on the interlayer insulating film 160. The source electrode 170 and the drain electrode 180 may be separated (e.g., may be separated by a predetermined distance) with respect to the gate electrode 150 and may be disposed adjacent to the gate electrode 150. For example, the source electrode 170 and the drain electrode 180 may penetrate through the interlayer insulating film 160 and contact the source region and the drain region of the semiconductor pattern 130, respectively. Each of the source electrode 170 and the drain electrode 180 may include a metal, an alloy, a metal nitride, a conductive metal oxide, a transparent conductive material, etc. For example, each of the source electrode 170 and the drain electrode 180 may comprise aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in any suitable combination. The formation of the source electrode 170 and the drain electrode 180 on the interlayer insulating film 160 may produce (or complete) a thin-film transistor (TFT), which includes the semiconductor pattern 130, the gate insulating layer 140, the gate electrode 150, the source electrode 170 and the drain electrode 180, that is located on the substrate 110 and may function as a switching device of the OLED display device 10. The source electrode 170 and the drain electrode 180 may be formed by a photolithography method, but the present invention is not limited thereto.

The planarization layer 190 may be formed on the interlayer insulating film 160 and may cover the source electrode 170 and the drain electrode 180. The planarization layer 190 may be thick enough to completely cover the source electrode 170 and the drain electrode 180. An upper surface of the planarization layer 190 may be flat. The planarization layer 190 may be made of an organic material or an inorganic material. For example, the planarization layer 190 may include an acrylic-based polymer, a polyimide-based polymer, a polyamide-based polymer, a siloxane-based polymer, a polymer that contains photosensitive acryl carboxyl, a novolak resin, an alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in any suitable combination.

The first electrode E1 may be located on the planarization layer 190. The first electrode E1 may be an anode or a cathode that provides holes or electrons to the organic layer EL in response to a signal transmitted to the drain electrode 180 of the TFT. The first electrode E1 may be used as a transparent electrode or a reflective electrode. To be used as the transparent electrode, the first electrode E1 may be made of indium tin oxide (ITO), indium zinc oxide (IZO), zinc oxide (ZnO), or $In_2O_3$. To be used as the reflective electrode, the first electrode E1 may be formed by forming a reflective layer using Ag, Mg, Al, Pt, Pd, Au, Ni, Nd, Ir, Cr or a compound of these materials, and then forming ITO, IZO, ZnO or $In_2O_3$ on the reflective layer. The first electrode E1 may be formed by a photolithography process, but the present invention is not limited thereto.

The pixel defining layer P may be formed on the first electrode E1 and the planarization layer 190. The pixel defining layer P may expose some regions of the first electrode E1. The pixel defining layer P may have openings that expose regions of the first electrode E1. The regions exposed by the pixel defining layer P may be the emission regions E that include the organic layer EL, and a region covered by the pixel defining layer P may be the non-emission region N. The organic layer EL is formed on the first electrode E1 through the openings of the pixel defining layer P. The pixel defining layer P may be made of an insulating material. Specifically, the pixel defining layer P may be made of at least one organic material selected from benzocyclobutene (BCB), polyimide (PI), polyamaide (PA), acrylic resin, and phenolic resin. As another example, the pixel defining layer P may be made of an inorganic material such as silicon nitride. The pixel defining layer P may be formed by a photolithography process, but the present invention is not limited thereto.

The organic layer EL is formed on the first electrode E1 that is exposed through the openings of the pixel defining layer P. The organic layer EL may include an organic emitting layer EML that emits light by recombining holes received from the first electrode E1 and electrons received from the second electrode E2. The holes and electrons provided to the organic emitting layer EML combine together to form excitions, and light is emitted as the excitons fall from an excited state to a ground state. The organic emitting layer EML may be a red emitting layer that emits red light, a green emitting layer that emits green light, and a blue emitting layer that emits blue light. The organic emitting layer EML may be made of an inorganic material such as Se or Zn, a small molecular weight organic material, or a polymer organic material. The organic layer EL may include a hole-injection layer HIL, a hole-transporting layer HTL, the organic emitting layer EML, an electron-transporting layer ETL, and an electron-injection layer EIL stacked sequentially on the first electrode E1. The hole-injection layer HIL, the hole-transporting layer HTL, the electron-transporting layer ETL, and the electron-injection layer EIL may be auxiliary layers designed (or configured) to easily deliver holes and electrons to the organic emitting layer EML.

The second electrode E2 is formed on the organic layer EL and may be a cathode, which provides electrons to the organic layer EL, or an anode, which provides holes to the organic layer EL. Like the first electrode E1, the second electrode E2 may be used as a transparent electrode or a reflective electrode. The second electrode E2 may be formed by a deposition process, but the present invention is not limited thereto.

The OLED display device 10 may further include an encapsulation substrate disposed on the second electrode E2. The encapsulation substrate may be made of an insulating substrate. A spacer may be disposed between the second electrode E2 disposed on the pixel defining layer P and the encapsulation substrate. In some embodiments of the present invention, the encapsulation substrate may be omitted. As such, in some embodiments, an encapsulation layer made of an insulating material may cover and protect the entire structure (e.g., may protect the structure in its entirety).

A cross-sectional area of the pixel defining layer P of the OLED device 10 according to one or more embodiments may vary according to height. For example, the pixel defining layer P may have a smaller cross-sectional area in a middle region between a lower region adjacent to the first electrode E1 and an upper region adjacent to the second electrode E2 relative to a cross-sectional area of the lower region and the upper region. Further, the cross-sectional area of the pixel defining layer P may be gradually reduced from the upper region toward the middle region and from the lower region toward the middle region. The structure of the pixel defining layer P is described further below with reference to FIGS. 2 through 4.

Figure 2:
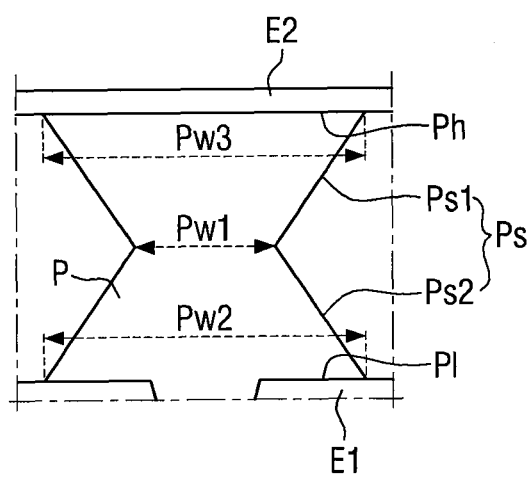
FIG. 2 is a cross-sectional view of a pixel defining layer according to one or more embodiments of the present invention.
Figure 3:
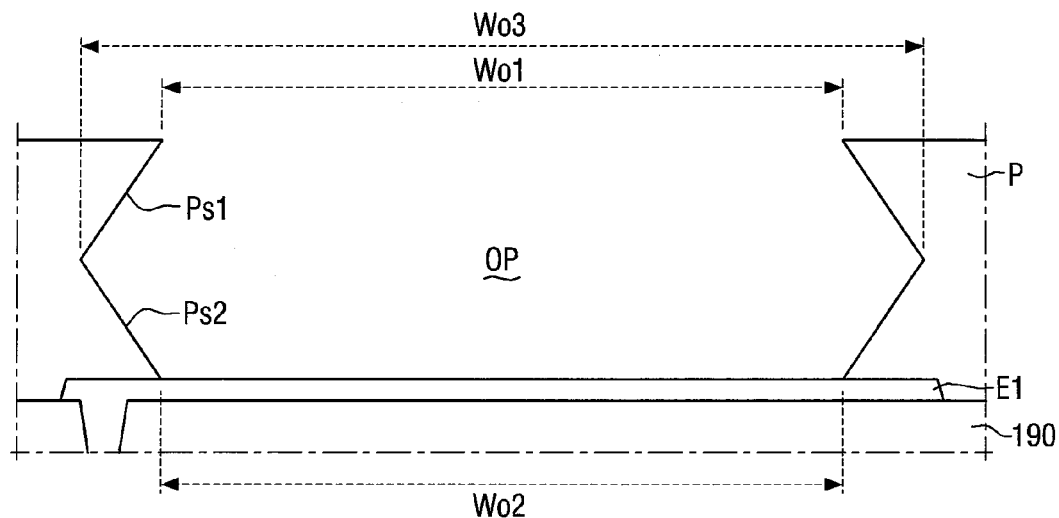
FIG. 3 is a cross-sectional view of an opening of the pixel defining layer.
Figure 4:
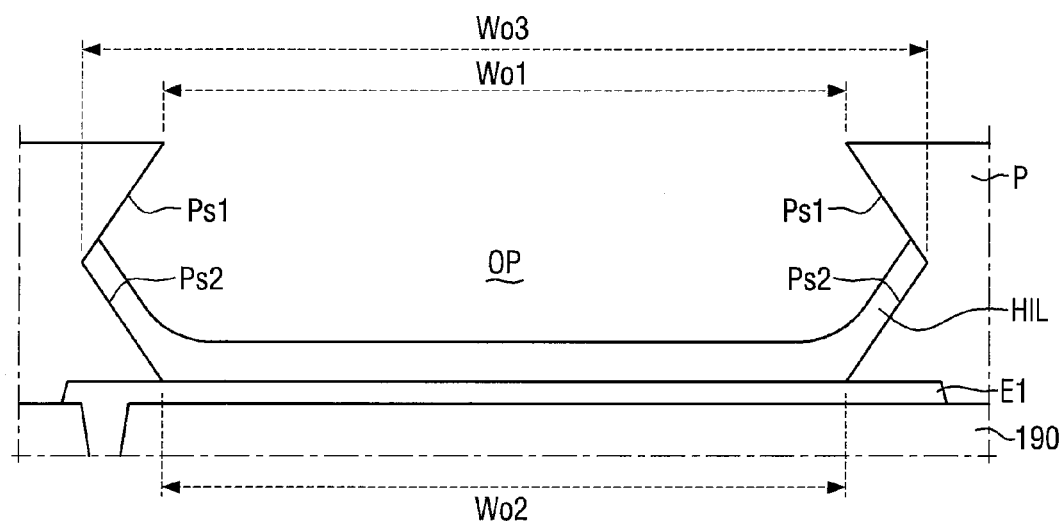
FIG. 4 is a cross-sectional view of a hole-injection layer formed in the opening of FIG. 3.

FIG. 2 is a cross-sectional view of a pixel defining layer P according to one or more embodiments of the present invention. FIG. 3 is a cross-sectional view of an opening OP of the pixel defining layer P. FIG. 4 is a cross-sectional view of a hole-injection layer HIL formed in the opening OP of FIG. 3.

Referring to FIGS. 2 through 4, the pixel defining layer P may include an upper surface Ph, a lower surface Pl, and a side surface Ps. The upper surface Ph of the pixel defining layer P may contact the second electrode E2, and the lower surface Pl of the pixel defining layer P may contact the first electrode E1 and the planarization layer 190. The side surface Ps may connect both sides of the upper surface Ph to both sides of the lower surface Pl and may contact ends of the organic layer EL. The side surface Ps of the pixel defining layer P may include a first side surface Ps1 and a second side surface Ps2. The first side surface Ps1 may slope downward from both sides of the upper surface Ph of the pixel defining layer P toward a central portion of the pixel defining layer P. The second side surface Ps2 may slope upward from both sides of the lower surface Pl of the pixel defining layer P toward the central portion of the pixel defining layer P. That is, the first side surface Ps1 and the second side surface Ps2 may slope in opposite directions. The downward sloping first side surface Ps1 and the upward sloping second side surface Ps2 may meet at the central portion of the pixel defining layer P, but the present invention is not limited thereto. A location where the first side surface Ps1 and the second side surface Ps2 converge may vary according to a height of the pixel defining layer P and an inclination angle of each of the first side surface Ps1 and the second side surface Ps2. The inclination angle of the first side surface Ps1 may be equal to the inclination angle of the second side surface Ps2, but the present invention is not limited thereto. Due to the sloping structure of the side surface Ps of the pixel defining layer P, a cross-sectional area Pw1 of the central portion between the upper portion and the lower portion may be smaller than a cross-sectional area Pw3 of the upper portion of the pixel defining layer P and a cross-sectional area Pw2 of the lower portion of the pixel defining layer P. The cross-sectional area Pw3 of the upper portion may be equal to the cross-sectional area Pw2 of the lower portion, but the present invention is not limited thereto. A minimum (or smallest) cross-sectional area of the pixel defining layer P may be formed at a location where the first side surface Ps1 and the second side surface Ps2 converge.

The pixel defining layer P may surround the first electrode E1 and may include the opening OP which partially exposes the first electrode E1. A width of the opening OP may vary according to a height of the pixel defining layer P. As described herein, the width of the opening OP corresponds to the size of the cross-sectional area of the opening OP. In the cross-sectional view of FIG. 3, a width Wo3 of a middle region between a lower region adjacent to the first electrode E1 and an upper region adjacent to the second electrode E2 of the opening OP may be greater than a width Wo2 of the lower region and a width Wo1 of the upper region. The width Wo1 of the upper region may be equal to the width Wo2 of the lower region, but the present invention is not limited thereto. The width of the opening OP may be gradually reduced from the middle region toward the lower region and toward the upper region. The width of the opening OP may reduce (or taper) at a constant or fixed rate, but the present invention is not limited thereto. For example, the width of the opening OP may be reduced at a gradually decreasing rate, or a not constant rate. The organic layer EL may be formed in the opening OP. The organic layer EL may be formed in the opening OP according to the shape of the opening OP.

The organic layer EL may be formed by a solution process, for example. The solution process may be one of spin coating, inkjet printing, gravure printing, roll-to-roll processing, syringe injection, dip coating, spray coating, relief printing, lithography printing, flexography printing, and screen printing. The solution process may include ejecting a solution composition from a spray nozzle onto a target object and leaving only the solution composition on the target object by distilling off a solvent in the solution composition using, e.g., a drying process.

When the organic layer EL is formed by the solution process, the pixel defining layer P may generally exhibit liquid repellency. Accordingly, the solution composition, even if it is ejected onto the pixel defining layer P, may not bond with the pixel defining layer P. Thus, the solution composition can easily move into the opening OP. However, a surface of the first electrode E1 may be made lyophilic in order to form the organic layer EL on the surface of the first electrode E1. That is, after the surface of the first electrode E1 inside the opening OP is made lyophilic, the solution composition may be ejected onto the pixel defining layer P. Accordingly, the liquid repellency of the pixel defining layer P around the first electrode E1 may be reduced. Ink of the organic layer EL that is accumulated on the first electrode E1 may rise along the slope of the pixel defining layer P having reduced liquid repellency. In particular, the hole-injection layer HIL accumulated on the first electrode E1 in the state of the solution composition may rise up the side surface Ps of the pixel defining layer P along the slope of the pixel defining layer P. Ends of the hole-injection layer HIL that are dried in this state may contact a layer other than the hole-transporting layer HTL. In particular, if the ends of the hole-injection layer HIL contact the second electrode E2, a current path that does not pass through the organic emitting layer EML may be formed. That is, a leakage current may be generated, thus degrading display quality.

The pixel defining layer P of the OLED display device 10 according to one or more embodiments of the present invention can hinder this rising phenomenon of the hole-injection layer HIL. For example, the downward sloping first side surface Ps1 of the pixel defining layer P can block (or prevent or reduce the likelihood of) the hole-injection layer HIL from rising up the surface of the pixel defining layer P. Because the hole-injection layer HIL of the solution composition cannot rise along the first side surface Ps1, which slopes in a different direction (e.g., in an opposite direction) relative to the second side surface Ps2, the hole-injection layer HIL may not extend up to the upper surface Ph of the pixel defining layer P. This may prevent (or reduce the likelihood of) the ends of the hole-injection layer HIL from contacting elements other than the hole-transporting layer HTL. In particular, it is possible to block the hole-injection layer HIL from contacting the second electrode E2 and to prevent (or reduce the likelihood of) generation of leakage current.

In addition, since the second side surface Ps2 of the pixel defining layer P slopes upward, the solution composition may be distributed widely along the slope of the second side surface Ps2. The solution composition that is distributed widely can be dried relatively easily because the solution composition contacts the outside area along a relatively large area. As such, an efficient drying process can be performed, thereby preventing (or reducing the likelihood of) a reduction in display quality due to remaining bubbles after drying. The upward sloping second side surface Ps2 can also improve the efficiency of light extraction by guiding light emitted from the organic emitting layer EML to propagate upward.

An OLED display device according to one or more embodiments of the present invention is described below.

In the following description, elements substantially identical to those described above are indicated by like reference numerals, and a redundant description thereof may be omitted or given briefly.

Figure 5:
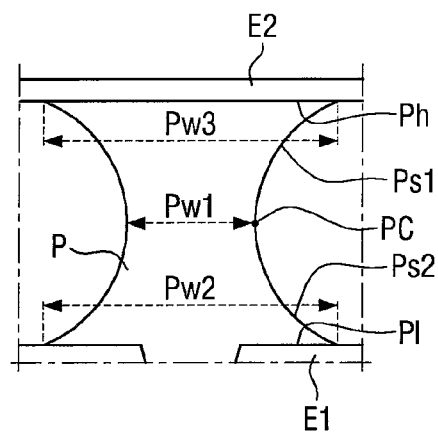
FIG. 5 is a cross-sectional view of a pixel defining layer according to one or more embodiments of the present invention.
Figure 6:
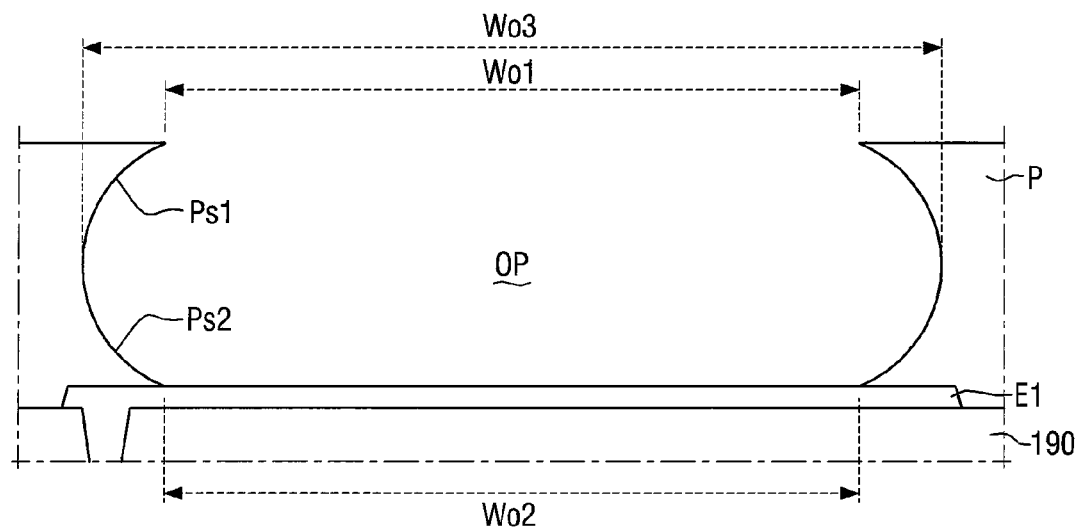
FIG. 6 is a cross-sectional view of an opening of the pixel defining layer.

FIG. 5 is a cross-sectional view of a pixel defining layer P according to one or more embodiments of the present invention. FIG. 6 is a cross-sectional view of an opening OP of the pixel defining layer P.

Referring to FIGS. 5 and 6, a side surface Ps of the pixel defining layer P may include a first side surface Ps1 sloping downward and a second side surface Ps2 sloping upward. The first side surface Ps1 may be a curved surface that slopes downward toward a central portion of the pixel defining layer P. The second side surface Ps2 may be a curved surface that slopes upward toward the central portion of the pixel defining layer P. A first end of the first side surface Ps1 and a second end of the second side surface Ps2 may meet at the central portion of the pixel defining layer P. For ease of description, a point at which the first side surface Ps1 and the second side surface Ps2 meet is referred to herein as a converging portion PC. The converging portion PC may be disposed at the central portion of the pixel defining layer P. The first side surface Ps1 and the second side surface Ps2 may converge in a gentle curve toward the converging portion PC (i.e., the first side surface Ps1 and the second side surface Ps2 may each be a curved surface). The slope of a tangent line on the first side surface Ps1 near the converging portion PC may be greater in magnitude than the slope of a tangent line on the first side surface Ps1 further from the converging portion PC and closer to the second electrode E2. Similarly, the slope of a tangent line on the second side surface Ps2 near the converging portion PC may be greater in magnitude than the slope of a tangent line on the second side surface Ps2 further from the converging portion PC and closer to the first electrode E1. That is, the slope of the curved surface of the first side surface Ps1 and of the second side surface Ps2 may be reduced in magnitude as the distance from the converging portion PC increases. The curved first side surface Ps1 sloping downward can block ends of the hole-injection layer HIL from contacting elements other than the hole-transporting layer HTL. In addition, the curved second side surface Ps2 that slopes upward can provide various angles of reflection, thereby improving the efficiency of light extraction.

One or more embodiments of the present invention are described herein. In the following description, elements that are substantially identical to those described above are indicated by like reference numerals, and a redundant description thereof may be omitted or given briefly.

Figure 7:
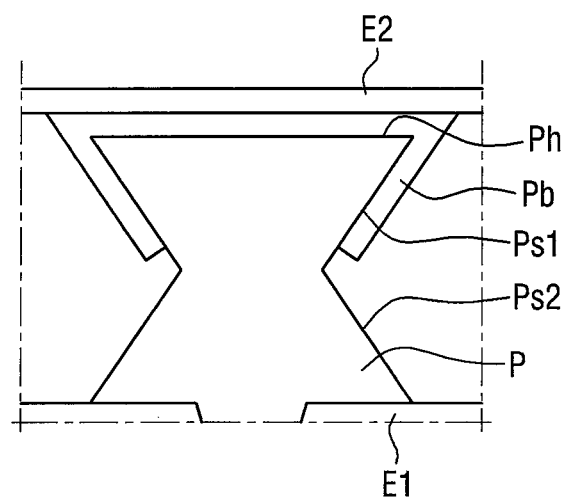
FIG. 7 is a cross-sectional view of a pixel defining layer according to one or more embodiments of the present invention.
Figure 8:
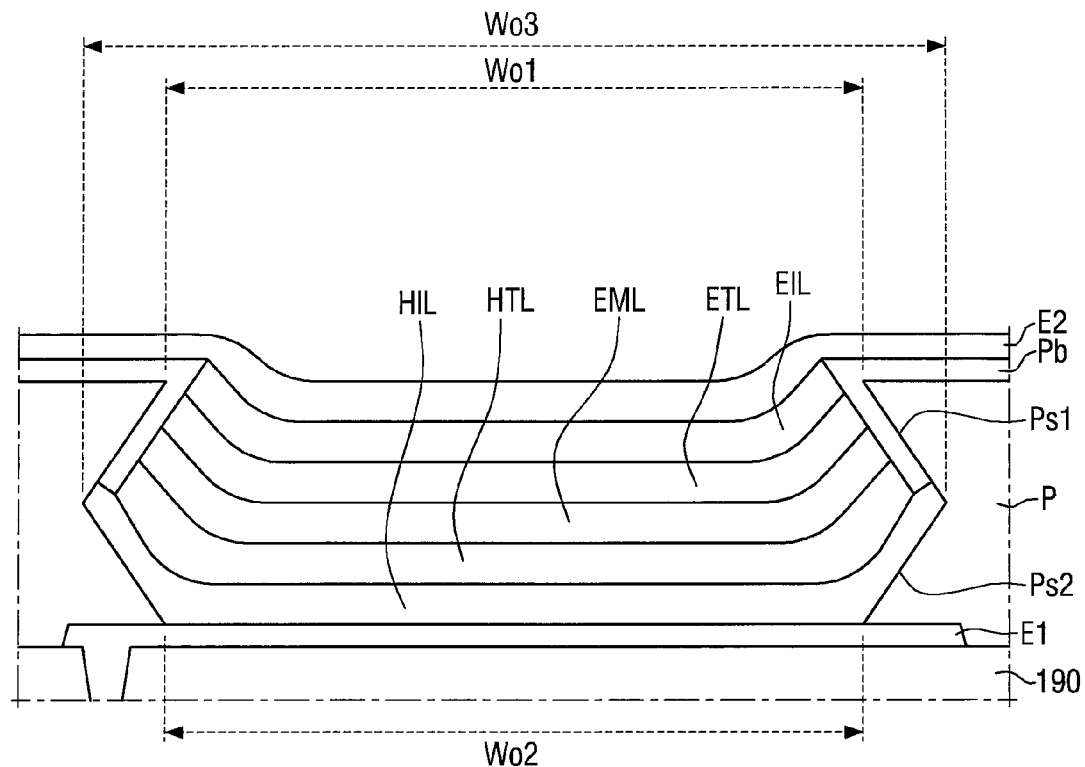
FIG. 8 is a cross-sectional view of a pixel according to one or more embodiments of the present invention.

FIG. 7 is a cross-sectional view of a pixel defining layer P according to one or more embodiments of the present invention. FIG. 8 is a cross-sectional view of a pixel according to one or more embodiments of the present invention.

Referring to FIGS. 7 and 8, an OLED display device according to another embodiment of the present invention may further include a leakage current blocking layer Pb.

The leakage current blocking layer Pb can block (or prevent or reduce the likelihood of) the hole-injection layer HIL from being connected to a second electrode E2. The leakage current blocking layer Pb may cover at least a portion of the first side surface Ps1 of the pixel defining layer P. The leakage current blocking layer Pb may be formed on an upper surface Ph and the first side surface Ps1 of the pixel defining layer P. However, the present invention is not limited thereto. The leakage current blocking layer Pb formed on the first side surface Ps1 can block the hole-injection layer HIL and the second electrode E2 from being directly connected to each other. The leakage current blocking layer Pb may be made of an organic material having greater resistance than the organic layer EL. The leakage current blocking layer Pb may be a cross-linked polymer compound obtained by heating or irradiating light to a polymer compound with a cross-linkable group, but the present invention is not limited thereto. Because the leakage current blocking layer Pb has greater resistance than the organic layer EL, an electric current may flow to the organic layer EL but not to the leakage current blocking layer Pb. As such, the leakage current blocking layer Pb can also block electrical connection of the second electrode E2 and the hole-injection layer HIL. The leakage current blocking layer Pb may be formed by an inkjet method, but the present invention is not limited thereto. The OLED display device including the leakage current blocking layer Pb can further prevent or reduce generation of leakage current.

A method of manufacturing an OLED display device according to one or more embodiments of the present invention is described below. In the following description, elements that are substantially identical to those described above are indicated by like reference numerals, and a redundant description thereof may be omitted or given briefly. The method of manufacturing an OLED display device according to one or more embodiments of the present invention is described herein with reference to FIGS. 9 through 18. FIGS. 9 through 17 are cross-sectional views illustrating operations or steps of a method of manufacturing an OLED device according to one or more embodiments of the present invention, and FIG. 18 is a flow chart of operations of a method of manufacturing an OLED display device according to one or more embodiments of the present invention.

The method of manufacturing an OLED display device according to one or more embodiments of the present invention includes an operation S110 of forming a first electrode on a substrate, an operation S120 of forming a pixel defining layer, an operation S130 of forming an organic layer, and an operation S140 of forming a second electrode.

First, the operation S110 of forming a first electrode on a substrate may be performed.

Figure 9:
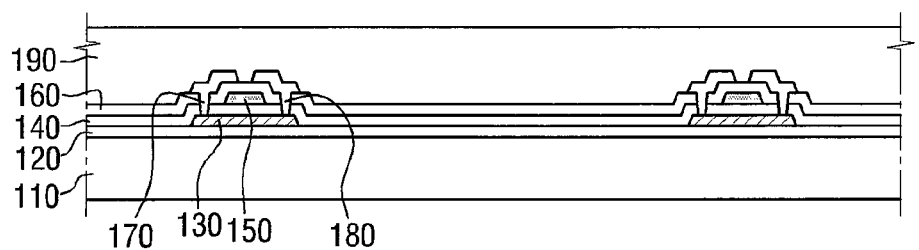
FIGS. 9 through 17 are cross-sectional views of operations of a method of manufacturing an OLED display device according to one or more embodiments of the present invention.
Figure 10:
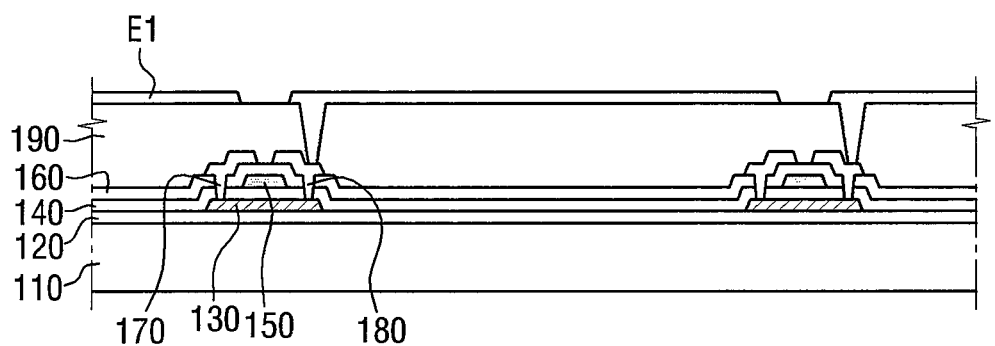
Figure 11:
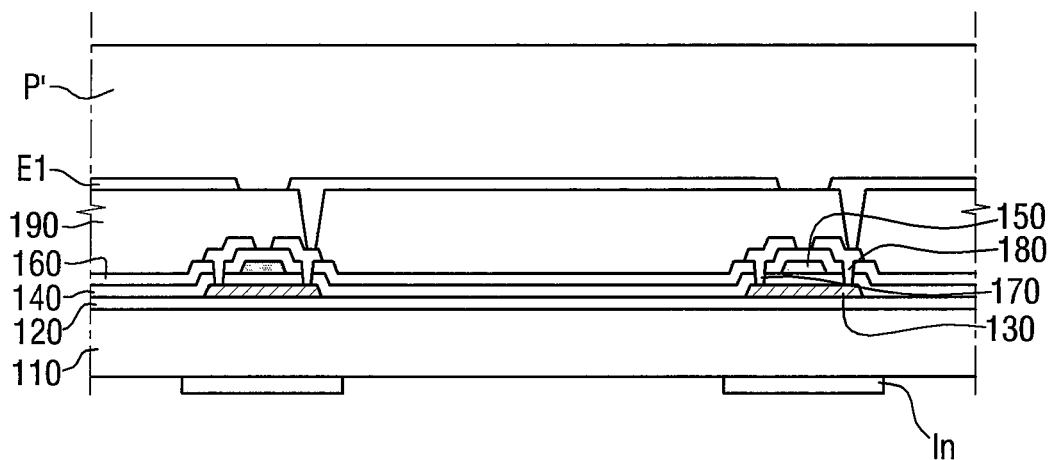
Figure 12:
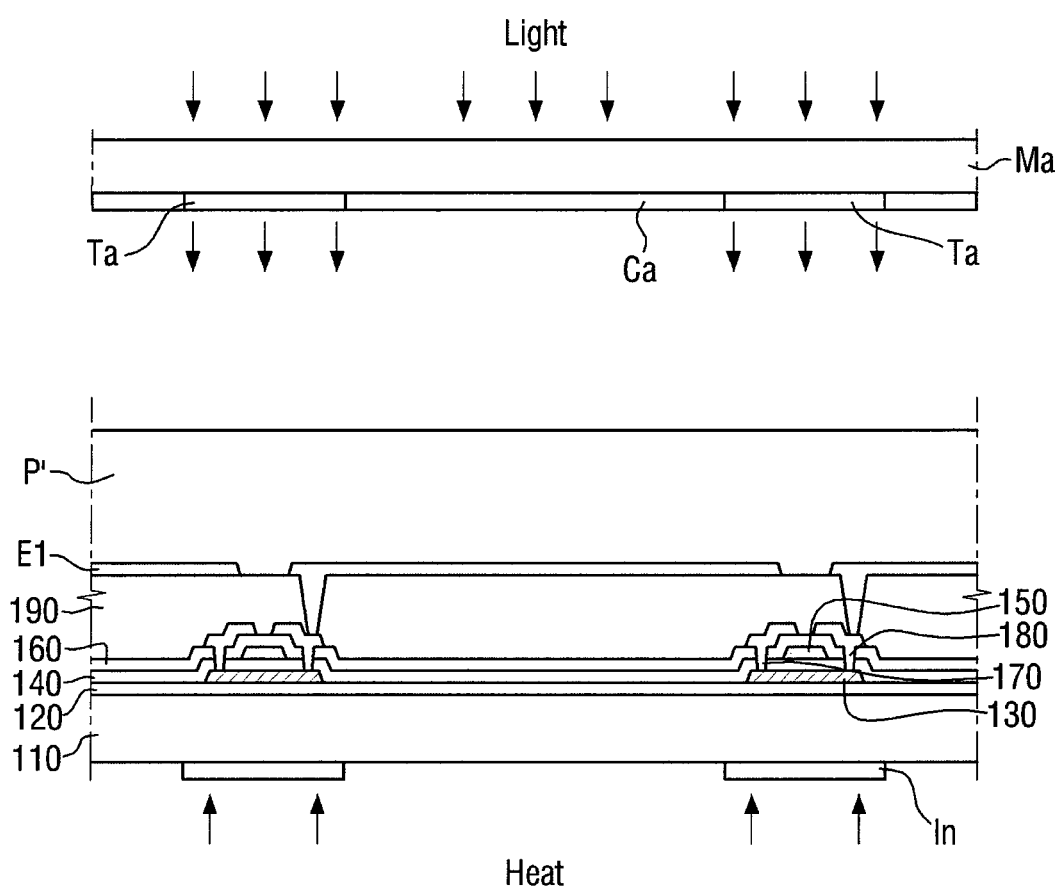

Referring to FIG. 9, a substrate 110 having a stacked structure with a buffer layer 120, a semiconductor pattern 130, a gate insulating layer 140, a gate electrode 150, an interlayer insulating film 160, a source electrode 170, a drain electrode 180, and a planarization layer 190 is formed or prepared. More specifically, the buffer layer 120 is formed on the entire surface of the substrate 110 (e.g., is formed on the surface of the substrate 110 in its entirety). Then, the semiconductor pattern 130 is formed by forming a semiconductor layer on the buffer layer 120 and then patterning the semiconductor layer. The gate insulating layer 140 is formed on the entire surface of the substrate 110 having the semiconductor pattern 130. The gate electrode 150 is formed by forming a conductive layer on the gate insulating layer 140 and then patterning the gate insulating layer 140. Next, the interlayer insulating film 160 is formed on the gate electrode 150, and the source electrode 170 and the drain electrode 180 are formed by forming a conductive layer on the interlayer insulating film 160 and then patterning the conductive layer. The planarization layer 190 is formed on the entire surface of the substrate 110. Next, referring to FIG. 10, a first electrode E1 is formed on the planarization layer 190. The first electrode E1 may be located on emission regions E of the substrate 110. In addition, the first electrode E1 may be electrically connected to the drain electrode 180 via a hole that penetrates the planarization layer 190.

Next, the operation S120 of forming a pixel defining layer is performed.

Referring to FIGS. 11 through 14, a pixel defining layer composition P' may be formed to a first thickness (e.g., a predetermined thickness) on the planarization layer 190 and the first electrode E1. The pixel defining layer composition P' may be coated on the entire surface of the substrate 110.

The pixel defining layer composition P' may be a negative photoresistor layer. The pixel defining layer composition P' may contain a material that undergoes a cross-linking reaction when exposed to ultraviolet (UV) light and/or heat. That is, after the pixel defining layer composition P' is selectively cured, an uncured portion of the pixel defining layer composition P' may be removed. Then, an additional curing process may be performed to produce a pixel defining layer P. The pixel defining layer P may be selectively patterned using a mask Ma which includes a plurality of light-blocking patterns Ca and a light-transmitting pattern Ta and a heating member In which can provide heat to a specific region of the pixel defining layer P. The mask Ma may include the light-blocking patterns Ca and the light-transmitting pattern Ta which surrounds the light-blocking patterns Ca. The light-blocking patterns Ca may be arranged in a matrix, but the present invention is not limited thereto. The light-blocking patterns Ca may correspond to the emission regions E, and the light-transmitting pattern Ta may correspond to a non-emission region N. Regions of the pixel defining layer composition P' that are overlapped by the light-blocking patterns Ca may be blocked from light provided from above the mask Ma by the light-blocking patterns Ca. Therefore, the regions of the pixel defining layer composition P' that are overlapped by the light-blocking patterns Ca may not undergo a cross-linking reaction and may not be cured. On the other hand, a region of the pixel defining layer composition P' that is overlapped by the light-transmitting pattern Ta may be cured from an upper portion thereof by the provided light (e.g., by light having a predetermined wavelength). As the region of the pixel defining layer composition P'0 that is overlapped by the light-transmitting pattern Ta is cured from the upper portion toward a lower portion thereof, the amount of light provided to the lower portion of the pixel defining layer composition P' may be gradually reduced. Therefore, the curing reaction may proceed such that the region of the pixel defining layer composition P' that corresponds to the light-transmitting pattern Ta is gradually reduced in width from the upper portion toward the lower portion. Meanwhile, heat may be selectively provided to the substrate 110 from under the substrate 110. Here, the heat may be provided by the heating member In placed under the substrate 110. The heating member In may have a flat plate shape, but the present invention is not limited thereto. The heating member In may be placed under the non-emission region N of the substrate 110. The heating member In may be placed under the substrate 110 to correspond to the light-transmitting pattern Ta.

Figure 13:
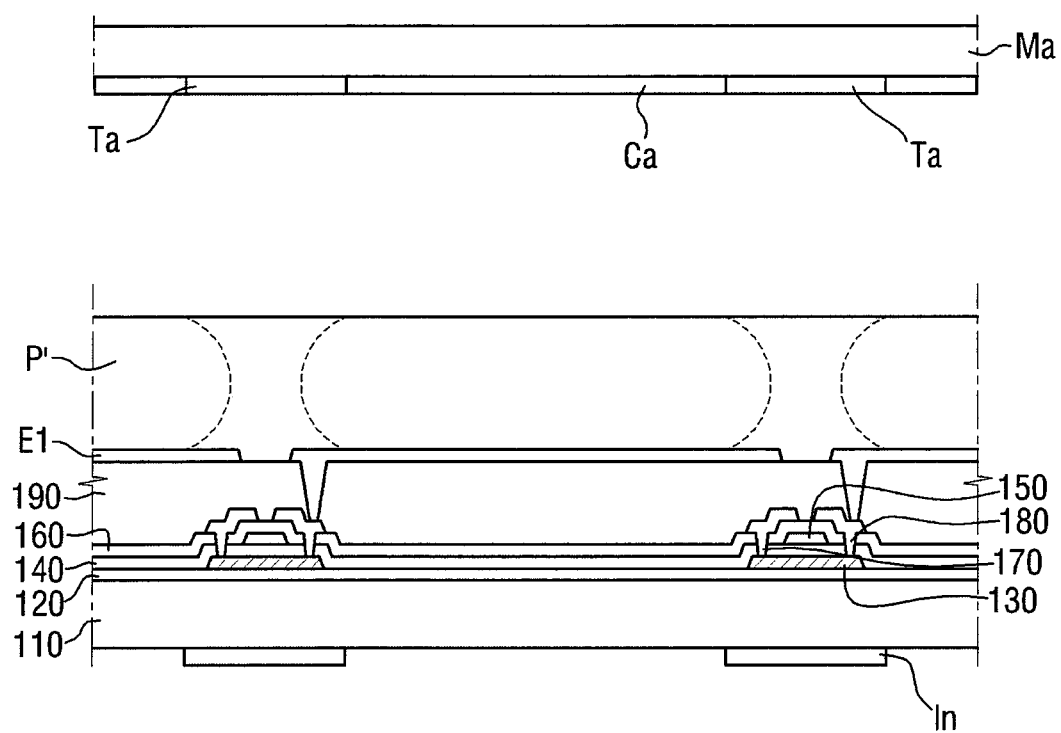
Figure 14:
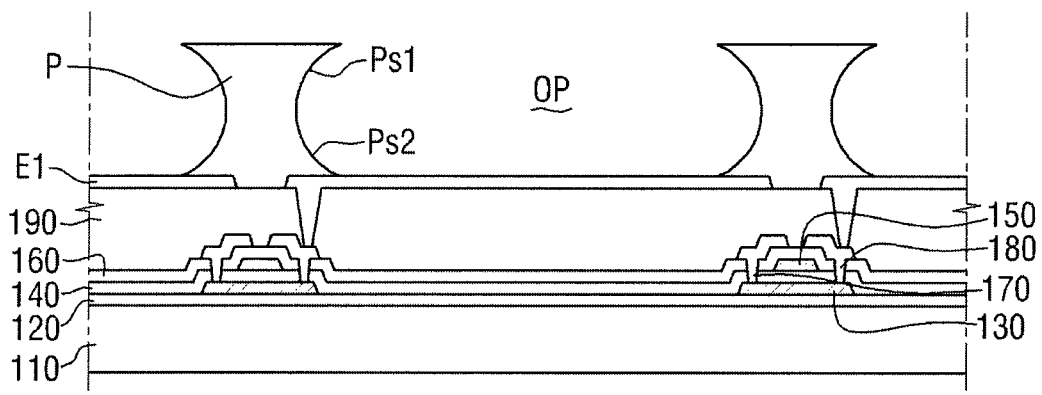
Figure 15:
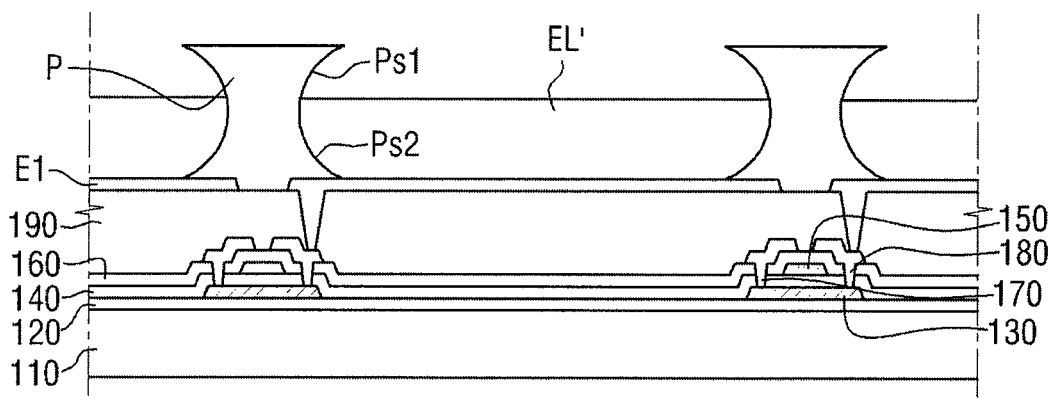

The pixel defining layer composition P' may be cured from the lower portion thereof by heat provided from under the substrate 110. As the cross-linking reaction proceeds, the temperature of the heat provided to the upper portion of the pixel defining layer composition P' may gradually fall because of the cured region. That is, the curing reaction may proceed such that the pixel defining layer composition P' is gradually reduced in width from the lower portion toward the upper portion. To adjust the width of the pixel defining layer P, heat may be provided to a location adjacent to each of the emission regions E, and the temperature of the heating member In may gradually fall as an exposure process proceeds. As the selective curing reactions by light and heat occur simultaneously, the pixel defining layer composition P' may be cured as illustrated in FIG. 13. Then, a development process and an additional curing reaction may produce the pixel defining layer P as illustrated in FIG. 14. That is, the pixel defining layer P may include a first side surface Ps1 which slopes downward from an upper surface of the pixel defining layer P toward a central portion thereof and a second side surface Ps2 which slopes upward from a lower surface of the pixel defining layer P toward the central portion thereof. As such, an opening OP of the pixel defining layer P may also have a greater width in a central portion than in an upper portion and a lower portion thereof.

Next, the operation S130 of forming an organic layer is performed.

An organic layer EL may be formed by a solution process. For the solution process, a surface of the pixel defining layer P may be made liquid-repellent, and a surface of the first electrode E1 may be made lyophilic. That is, the surface of the first electrode E1 onto which a solution composition EL' is ejected and which is located inside the opening OP may be made lyophilic, and the pixel defining layer P around the first electrode E1 may be made liquid-repellent. As such, the solution composition EL', even if ejected onto the pixel defining layer P, does not bond with the pixel defining layer P. Thus, the solution composition EL' can easily move into the opening OP. Making the pixel defining layer P liquid-repellent may be a process of forming fluoride ions on the surface of the pixel defining layer P. Alternatively, a process of attaching fluoride ions onto the surface of the pixel defining layer P may be used to make the pixel defining layer P liquid-repellant. A fluoride compound such as $CF_4$ may be used as a reaction gas. For example, fluoride ions may be generated by applying plasma or UV light in the atmosphere of a $CF_4$ gas. Then, the fluoride ions may adhere to the surface of the pixel defining layer P. The surface of the pixel defining layer P bonded with fluoride may have a low surface energy and thus exhibit liquid repellency. Whether the pixel defining layer P is lyophilic or liquid-repellent may be determined by the concentration of fluoride ions on the surface of the pixel defining layer P. The method of making the pixel defining layer P is made liquid-repellent is not limited to the above examples. For example, the pixel defining layer P may be formed of an organic or inorganic material that contains fluoride ions, and the fluoride ions may be exposed through the surface of the pixel defining layer P by applying heat (e.g., heat at a predetermined temperature) to the pixel defining layer P. The surface of the first electrode E1 onto which the solution composition EL' is ejected and which is located inside the opening OP may be made lyophilic. The first electrode E1 may be pre-heated (e.g., at the predetermined temperature) to adjust particles on the surface thereof and the surface energy. In the pre-heating process at the predetermined temperature, fluoride ions formed on the surface of the first electrode E1 may be removed. The surface of the first electrode E1 may have a high surface energy. The surface energy of the first electrode E1 may affect some regions of the pixel defining layer P. Accordingly, some side surfaces of the pixel defining layer P may become lyophilic. The solution composition EL' may accumulate in the opening OP. The organic layer EL may include a hole-injection layer HIL, a hole-transporting layer HTL, an organic emitting layer EML, an electron-transporting layer ETL, and an electron-injection layer EIL stacked sequentially on the first electrode E1. The solution composition EL' illustrated in FIG. 15 may be the hole-injection layer HIL. The solution composition EL' may form a pinning point on a side surface of the pixel defining layer P. Here, the pinning point may denote a highest location at which the solution composition EL' contacts the pixel defining layer P. Because the first side surface Ps1 slopes downward, the solution composition EL' cannot rise up to an upper end of the first side surface Ps1 but forms a pinning point at a location higher than a boundary region between the second side surface Ps2 and the first side surface Ps1. That is, in the method of manufacturing an OLED device according to one or more embodiments of the present invention, the pixel defining layer P including the first side surface Ps1 sloping downward can prevent the hole-injection layer HIL from contacting the second electrode E2.

Figure 16:
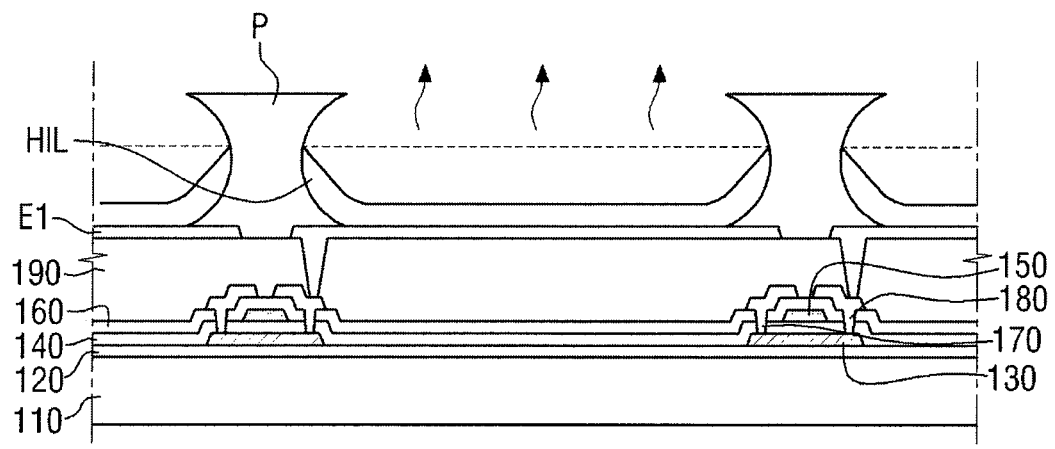

Referring to FIG. 16, a solvent in the solution composition EL' is evaporated by a drying process. Therefore, only the elements of the solution composition EL' may form a printing layer. The solution composition EL' may have a large area of contact with the outside air because it is distributed widely by the second side surface Ps2 that slopes upward. That is, an efficient drying process can be performed, thus preventing a reduction in display quality due to remaining bubbles after drying. In addition, the second side surface Ps2 sloping upward can improve the efficiency of light extraction by guiding light emitted from the organic emitting layer EML to propagate upward. The other layers of the organic layer EL can also be stacked sequentially using the above-described solution process. However, the present invention is not limited thereto. For example, in some embodiments, the hole-injection layer HIL, the hole-transporting layer HTL, and the organic emitting layer EML may be formed by a solution process, and the electron-transporting layer ETL and the electron-injection layer EIL may be deposited by sputtering.

Next, the operation S140 of forming a second electrode is performed.

Figure 17:
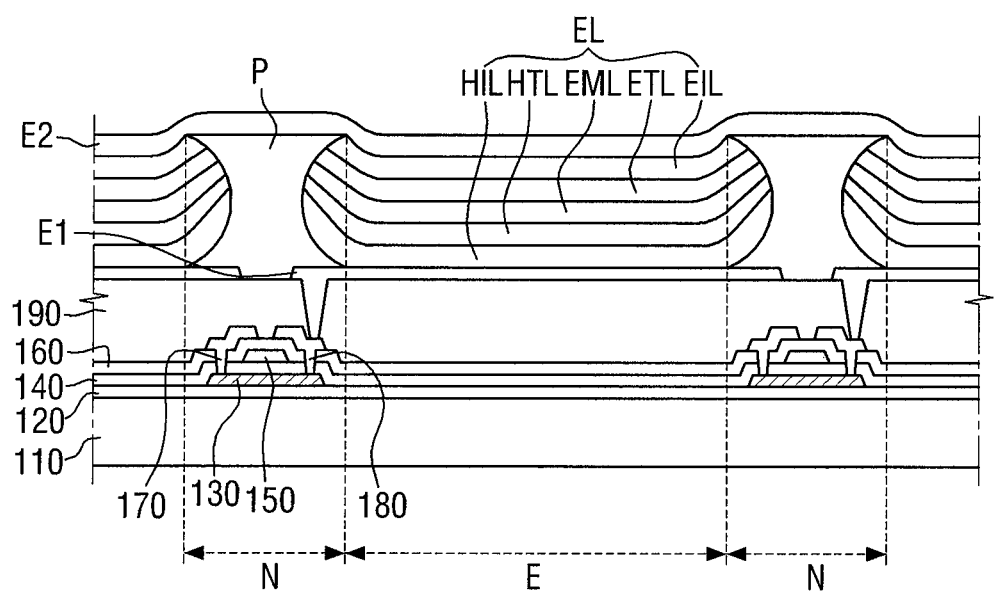
Figure 18:
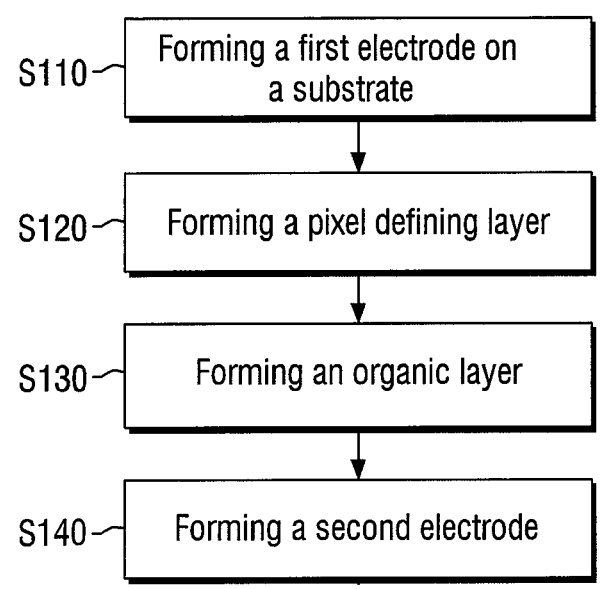
FIG. 18 is a flow chart of operations of a method of manufacturing an OLED display device according to one or more embodiments of the present invention.

A second electrode E2, which may be a cathode, may be formed on the entire surface of the substrate 110 as illustrated in FIG. 17.

The method of manufacturing an OLED display device according to one or more embodiments of the present invention may further include forming a leakage current blocking layer Pb between formation of the hole-injection layer HIL and formation of the hole-transporting layer HTL. The leakage current blocking layer Pb may be a cross-linked polymer compound and may have a high resistance value. The leakage current blocking layer Pb may be formed to cover at least the first side surface Ps1 of the pixel defining layer P. Because the leakage current blocking layer Pb has high resistance, an electric current may flow to the organic layer EL but not to the leakage current blocking layer Pb. The leakage current blocking layer Pb may be formed by an inkjet method, but the present invention is not limited thereto.

As such, one or more embodiments of the present invention provide an OLED display device that may prevent or reduce generation of leakage current and improve display quality.

The above and other aspects of the present invention will become more apparent to one of ordinary skill in the art to which the present invention pertains by referencing the detailed description, drawings, and claims.

Although example embodiments of the present invention have been disclosed herein for illustrative purposes, the embodiments are only examples and do not limit the present invention. Those skilled in the art will appreciate that various modifications and applications are possible without departing from the scope and spirit of the invention as disclosed in the accompanying claims. For example, each element specified in embodiments of the present invention can be variously modified and implemented. Further, differences related to such modifications and applications should be interpreted as being comprised in the scope of the present invention defined by the accompanying claims, and their equivalents.

What is claimed is:

1. An organic light-emitting diode (OLED) display device comprising:
    a substrate;
    a first electrode on the substrate;
    a pixel defining layer on the substrate and having an opening that partially exposes the first electrode;
    an organic layer on the first electrode; and
    a second electrode on the organic layer and the pixel defining layer,
    wherein the opening comprises a lower region adjacent to the first electrode, an upper region adjacent to the second electrode, and a middle region between the lower region and the upper region, wherein the middle region has a width that is greater than a width of the lower region and is greater than a width of the upper region, and
    wherein a width of the opening is gradually reduced from the middle region toward the lower region and from the middle region toward the upper region.

2. The OLED display device of claim 1, wherein the width of the opening is reduced at a gradually decreasing rate.

3. The OLED display device of claim 1, wherein the width of the opening is reduced at a constant rate.

4. The OLED display device of claim 1, wherein the pixel defining layer comprises a lower surface that contacts the substrate and the first electrode, an upper surface that contacts the second electrode, and a side surface that connects respective sides of the upper surface and the lower surface, and wherein the side surface comprises a first side surface that slopes downward toward a central portion of the pixel defining layer and a second side surface that slopes upward toward the central portion of the pixel defining layer.

5. An organic light-emitting diode (OLED) display device comprising:
    a substrate;
    a first electrode on the substrate;

a pixel defining layer on the substrate and having an opening that partially exposes the first electrode;
an organic layer on the first electrode;
a second electrode on the organic layer and the pixel defining layer; and
a leakage current blocking layer covering at least a portion of the first side surface,
wherein the opening comprises a lower region adjacent to the first electrode, an upper region adjacent to the second electrode, and a middle region between the lower region and the upper region, wherein the middle region has a width that is greater than a width of the lower region and is greater than a width of the upper region,
wherein the pixel defining layer comprises a lower surface that contacts the substrate and the first electrode, an upper surface that contacts the second electrode, and a side surface that connects respective sides of the upper surface and the lower surface, and
wherein the side surface comprises the first side surface that slopes downward toward a central portion of the pixel defining layer and a second side surface that slopes upward toward the central portion of the pixel defining layer.

6. The OLED display device of claim 1, wherein the organic layer comprises a hole-injection layer and an organic emitting layer on the hole-injection layer, and wherein ends of the hole-injection layer are not connected to the second electrode.

7. An OLED display device comprising:
a substrate;
a first electrode on the substrate;
a pixel defining layer on the substrate and having an opening partially exposing the first electrode;
an organic layer on the first electrode; and
a second electrode on the organic layer and the pixel defining layer,
wherein the pixel defining layer comprises a lower region adjacent to the first electrode, an upper region adjacent to the second electrode, and a middle region between the lower region and the upper region, and wherein a cross-sectional area of the upper region and a cross-sectional area of the lower region are each greater than a cross-sectional area of the middle region.

8. The OLED display device of claim 7, wherein a cross-sectional area of the pixel defining layer is gradually reduced from the upper region toward the middle region and from the lower region toward the middle region.

9. The OLED display device of claim 7, wherein the pixel defining layer comprises a lower surface that contacts the first electrode, an upper surface that contacts the second electrode, and a side surface that connects respective sides of the lower surface and the upper surface, and wherein the side surface comprises a first side surface that slopes downward toward a central portion of the pixel defining layer and a second side surface that slopes upward toward the central portion of the pixel defining layer.

10. The OLED display device of claim 9, wherein the first side surface is an inclined surface having a first slope and the second side surface is an inclined surface having a second slope.

11. The OLED display device of claim 7, wherein the first side surface is a curved surface that slopes downward toward the central portion of the pixel defining layer and the second side surface is a curved surface that slopes upward toward the central portion of the pixel defining layer.

12. The OLED display device of claim 9, further comprising a leakage current blocking layer covering at least a portion of the first side surface.

13. The OLED display device of claim 7, wherein the organic layer comprises a hole-injection layer and an organic emitting layer located on the hole-injection layer, and wherein ends of the hole-injection layer are not connected to the second electrode.

14. A method of manufacturing an OLED display device, the method comprising:
forming a first electrode on a substrate;
coating a pixel defining layer composition on a first surface of the substrate;
selectively curing the pixel defining layer composition by selectively irradiating light on the first surface of the substrate and selectively providing heat to a second surface of the substrate;
forming a pixel defining layer having an opening that partially exposes the first electrode, the opening being formed by removing an uncured region of the pixel defining layer composition;
forming an organic layer in the opening; and
forming a second electrode on the organic layer and the pixel defining layer,
wherein the opening comprises a lower region adjacent to the first electrode, an upper region adjacent to the second electrode, and a middle region between the lower region and the upper region, wherein the middle region has a width that is greater than a width of the lower region and is greater than a width of the upper region, and
wherein a width of the opening is gradually reduced from the middle region toward the lower region and from the middle region toward the upper region.

15. The method of claim 14, wherein the pixel defining layer comprises a lower surface that contacts the substrate and the first electrode, an upper surface that contacts the second electrode, and a side surface that connects respective sides of the upper surface and the lower surface, wherein the side surface comprises a first side surface that slopes downward toward a central portion of the pixel defining layer and a second side surface that slopes upward toward the central portion of the pixel defining layer.

16. The method of claim 14, wherein the selectively curing of the pixel defining layer composition comprises irradiating light to a region of the first surface of the substrate using a mask, the mask comprising a light-transmitting portion and a light-blocking portion and the region of the first surface of the substrate corresponding to the light-transmitting portion, and
providing heat to a region of the second surface of the substrate corresponding to the light-transmitting portion by placing a heating member on the region of the second surface of the substrate.

17. The method of claim 14, wherein the pixel defining layer composition is gradually cured by the light from an upper portion toward a lower portion thereof and is gradually cured by the heat from the lower portion toward the upper portion thereof.

18. The method of claim 14, wherein the organic layer is formed by a solution process.

19. The method of claim 14, wherein the organic layer comprises a hole-injection layer and an organic emitting layer on the hole-injection layer, and wherein ends of the hole-injection layer are not connected to the second electrode.

* * * * *